United States Patent
Lu et al.

(10) Patent No.: US 9,728,455 B2
(45) Date of Patent: Aug. 8, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsin-Chu (TW); Feng-Yi Chang, Tainan (TW); Chieh-Te Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/404,163

(22) Filed: Jan. 11, 2017

(65) Prior Publication Data
US 2017/0125291 A1 May 4, 2017

Related U.S. Application Data

(62) Division of application No. 14/591,936, filed on Jan. 8, 2015, now Pat. No. 9,583,388.

(30) Foreign Application Priority Data

Dec. 16, 2014 (TW) .............................. 103143925 A

(51) Int. Cl.
*H01L 21/20* (2006.01)
*H01L 21/768* (2006.01)
*H01L 23/535* (2006.01)
*H01L 23/532* (2006.01)

(52) U.S. Cl.
CPC .. *H01L 21/76895* (2013.01); *H01L 21/76805* (2013.01); *H01L 23/535* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 8,358,012 B2 | 1/2013 | Haran et al. | |
| 2007/0080404 A1 | 4/2007 | Fukuro | |
| 2010/0090286 A1 | 4/2010 | Lee | |
| 2011/0183512 A1 | 7/2011 | Cho | |
| 2012/0256152 A1 | 10/2012 | Kakegawa | |
| 2013/0065394 A1* | 3/2013 | Suen | H01L 21/7684 438/672 |
| 2013/0248990 A1 | 9/2013 | Kim | |
| 2014/0138794 A1 | 5/2014 | Yang | |
| 2014/0332871 A1 | 11/2014 | Kim | |
| 2016/0043186 A1 | 2/2016 | Liu | |

OTHER PUBLICATIONS

Ching-Wen Hung, Title of Invention: Method of Forming Semiconductor Structure Having Contact Plug, U.S. Appl. No. 13/740,289, filed Jan. 14, 2013.

* cited by examiner

*Primary Examiner* — Reema Patel
(74) *Attorney, Agent, or Firm* — Winston Hsu

(57) ABSTRACT

A method for fabricating semiconductor device includes the steps of: providing a substrate having a gate structure thereon and an interlayer dielectric (ILD) layer surrounding the gate structure; forming a sacrificial layer on the gate structure; forming a first contact plug in the sacrificial layer and the ILD layer; removing the sacrificial layer; and forming a first dielectric layer on the gate structure and the first contact plug.

8 Claims, 9 Drawing Sheets

SEMICONDUCTOR DEVICE AND METHOD FOR FABRICATING THE SAME

CROSS REFERENCE TO RELATED APPLICATIONS

This application is a division of U.S. application Ser. No. 14/591,936 filed Jan. 8, 2015, and incorporated herein by reference in its entirety.

BACKGROUND OF THE INVENTION

1. Field of the Invention

The invention relates to a method for fabricating semiconductor device, and more particularly, to a method of forming dielectric layer around contact plugs.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and contact plugs still faces some issues in conventional FinFET fabrication. For instance, issues such as tiger tooth often arise when contact holes are formed with poor accuracy influencing the interconnection of contact plugs and overall performance of the device. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. The method includes the steps of: providing a substrate having a gate structure thereon and an interlayer dielectric (ILD) layer surrounding the gate structure; forming a sacrificial layer on the gate structure; forming a first contact plug in the sacrificial layer and the ILD layer; removing the sacrificial layer; and forming a first dielectric layer on the gate structure and the first contact plug.

According to another aspect of the present invention, a semiconductor device is disclosed. The semiconductor device includes: a substrate having a gate structure thereon and an interlayer dielectric (ILD) layer surrounding the gate structure; a first contact plug in the ILD layer; and a first dielectric layer conformally formed on the ILD layer and the gate structure and around the first contact plug.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
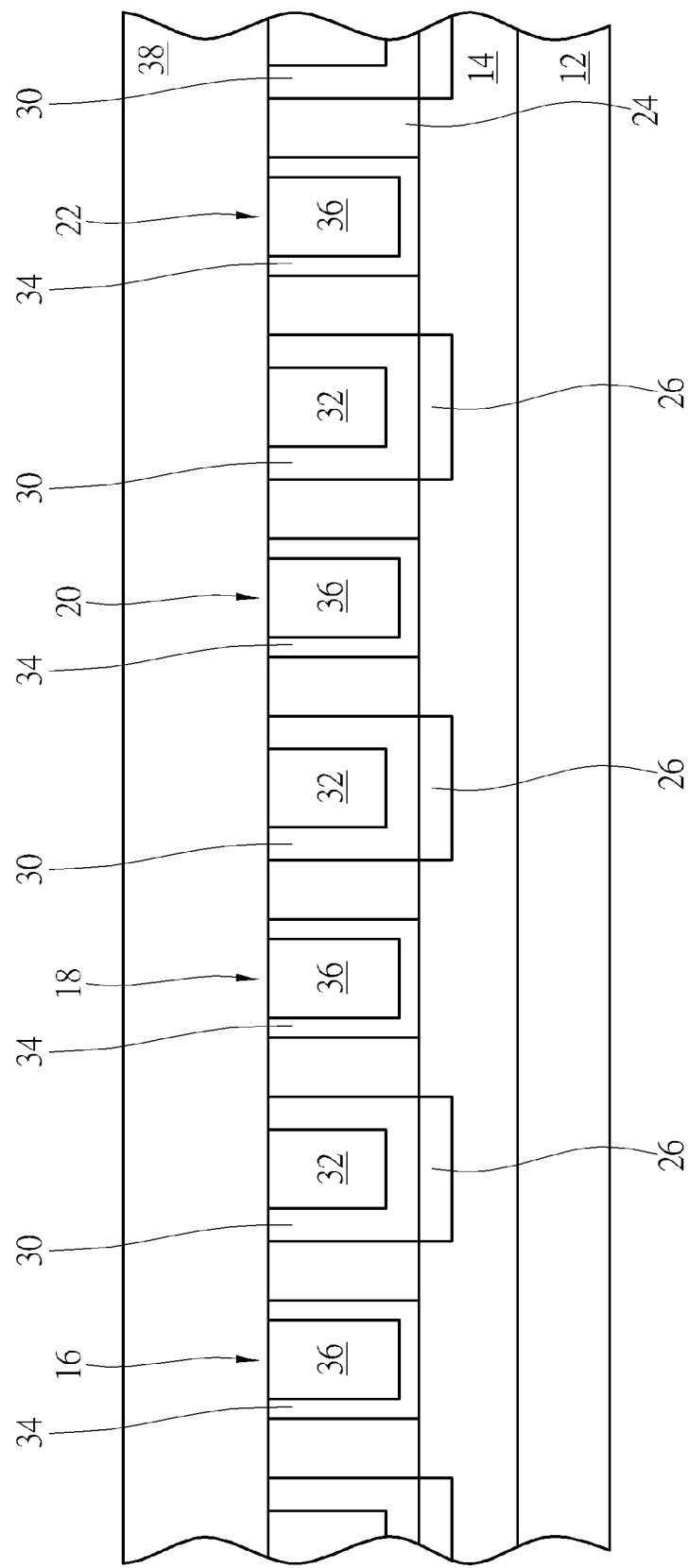
FIGS. 1-8 illustrate a method for fabricating semiconductor device according to a first embodiment of the present invention.

Referring to FIGS. 1-8, FIGS. 1-8 illustrate a method for fabricating semiconductor device according to a first embodiment of the present invention. Despite this embodiment pertains to a non-planar transistor fabrication process, the embodiment could be applied to both planar and non-planar transistor fabrication process. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 16, 18, 20, 22 is formed on part of the fin-shaped structure 14.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

The fabrication of the gate structures 16, 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and/or epitaxial layer (not shown) is then formed in the fin-shaped structure 14 and/or substrate 12 adjacent to two sides of the spacer 24, a silicide layer (not shown) is selectively formed on the source/drain region 26 and/or epitaxial layer, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gates into metal gates

16, 18, 20, 22. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surfaces of the U-shaped work function layer 34 and low resistance metal layer 36 are even with the surface of the ILD layer 32. Preferably, the high-k dielectric layer (not shown) could be I-shaped or U-shaped depending on whether the layer is fabricated by a high-k first process or high-k last process.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 34 having a work function ranging between 4.8 eV and 5.2 eV may include titanium nitride (TiN), tantalum nitride (TaN), tantalum carbide (TaC), but is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

A sacrificial layer 38 is then formed on the gate structures 16, 18, 20, 22 and ILD layer 32, in which the sacrificial layer 38 could include silicon oxide, TEOS, or a bottom anti-reflective layer (BARC).

Figure 2:
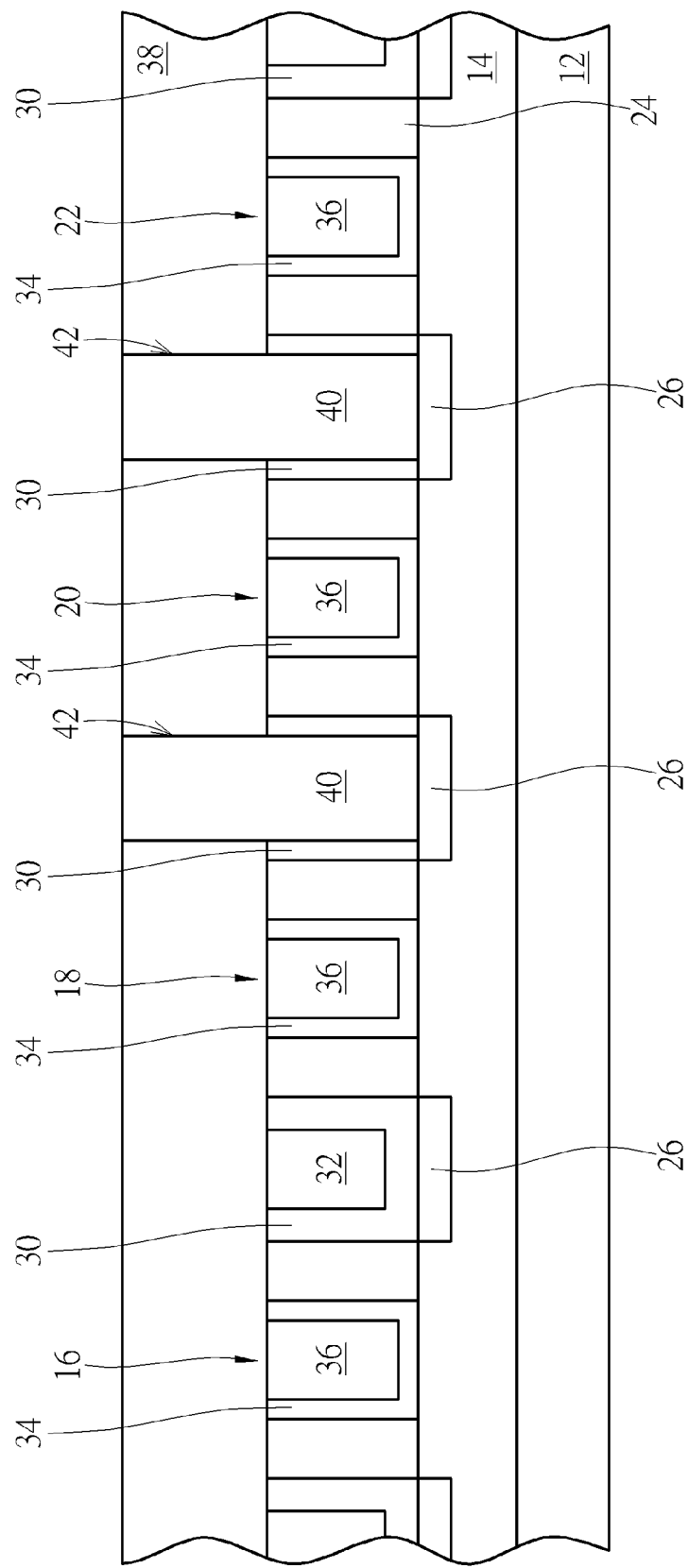

Next, as shown in FIG. 2, at least one first contact plug, such as the two contact plugs 40 shown in the figure are formed in the sacrificial layer 38, the CESL 30, and ILD layer 32. In this embodiment, the formation of the first contact plugs 40 could be accomplished by first removing part of the sacrificial layer 38, part of the CESL 30, and part of the ILD layer 32 to form a plurality of contact holes 42, selectively forming a silicide layer (not shown) on the source/drain region 26 and/or epitaxial layer surface at the bottom of the contact holes 42, and then sequentially depositing a barrier/adhesive layer (not shown), a seed layer (not shown), and a conductive layer (not shown) into and filling the contact holes 42, in which the barrier/adhesive layer is conformally deposited into the contact holes 42 while the conductive layer is filled the contact holes 42 entirely. The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and most preferably tungsten. Next, a planarizing process such as CMP process and/or etching process is conducted to remove part of the barrier/adhesive layer, seed layer, and conductive layer so that the top surface of the remaining conductive layer is even with the top surface of the sacrificial layer 38 to form first contact plugs 40.

Figure 3:
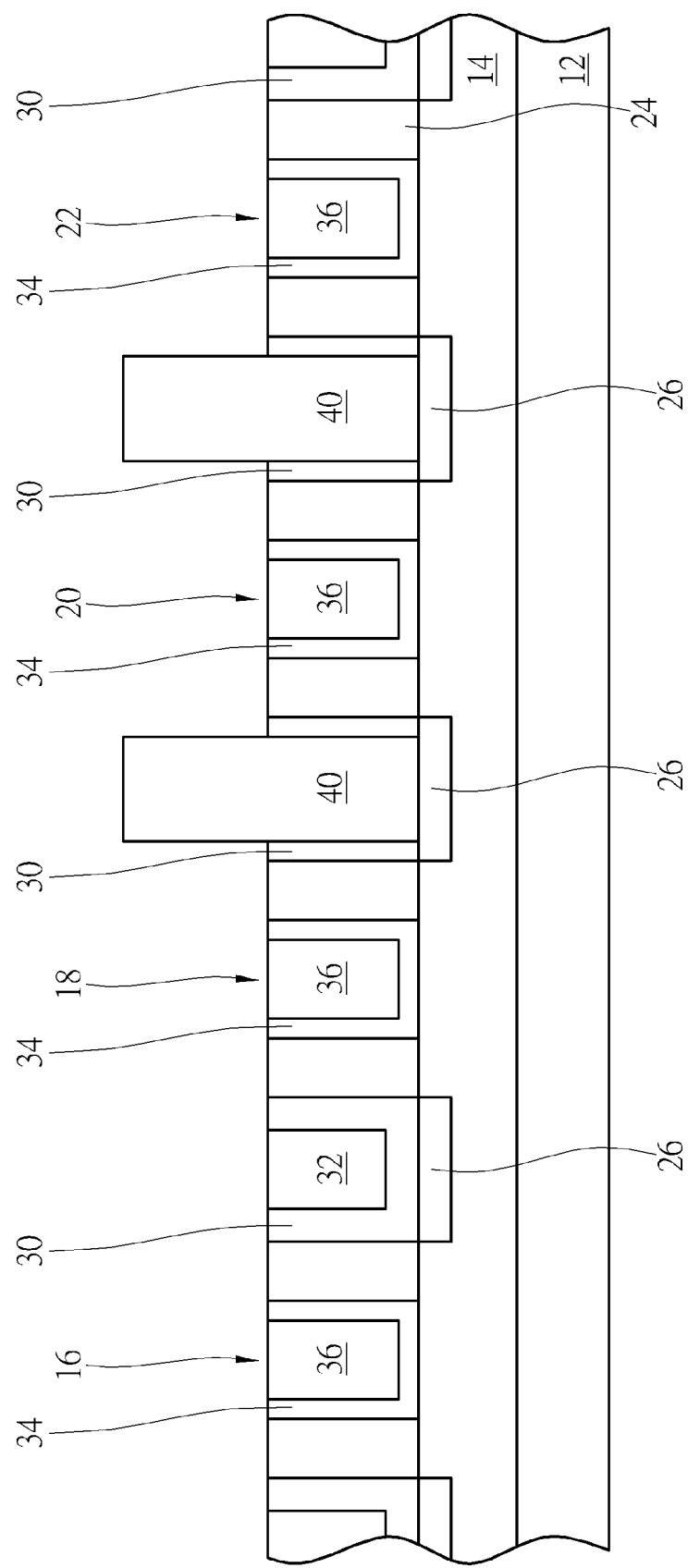

Next, as shown in FIG. 3, a dry etching or wet etching process, such as a plasma etching process is conducted to completely remove the sacrificial layer 38 for exposing the gate structures 16, 18, 20, 22, the top of ILD layer 32, and part of the first contact plugs 40. In this embodiment, the sacrificial layer 38, CESL 30, and ILD layer 32 are preferably composed of different material. For example, the sacrificial layer 38 could be composed of TEOS and the ILD layer 32 could be formed by material utilizing high-density plasma (HDP) or flowable chemical vapor deposition (FCVD) process, in which the sacrificial layer 38 preferably contains higher oxygen content while the ILD layer 32 fabricated by HDP or FCVD contains lower oxygen content. Next, end point detector is preferably utilized to precisely control parameters of the etching process based on oxygen content detected during the removal of the sacrificial layer 38, such that the planeness of the top surfaces of the gate structures 38, spacer 24, CESL 30, and ILD layer 32 could be maintained.

Figure 4:
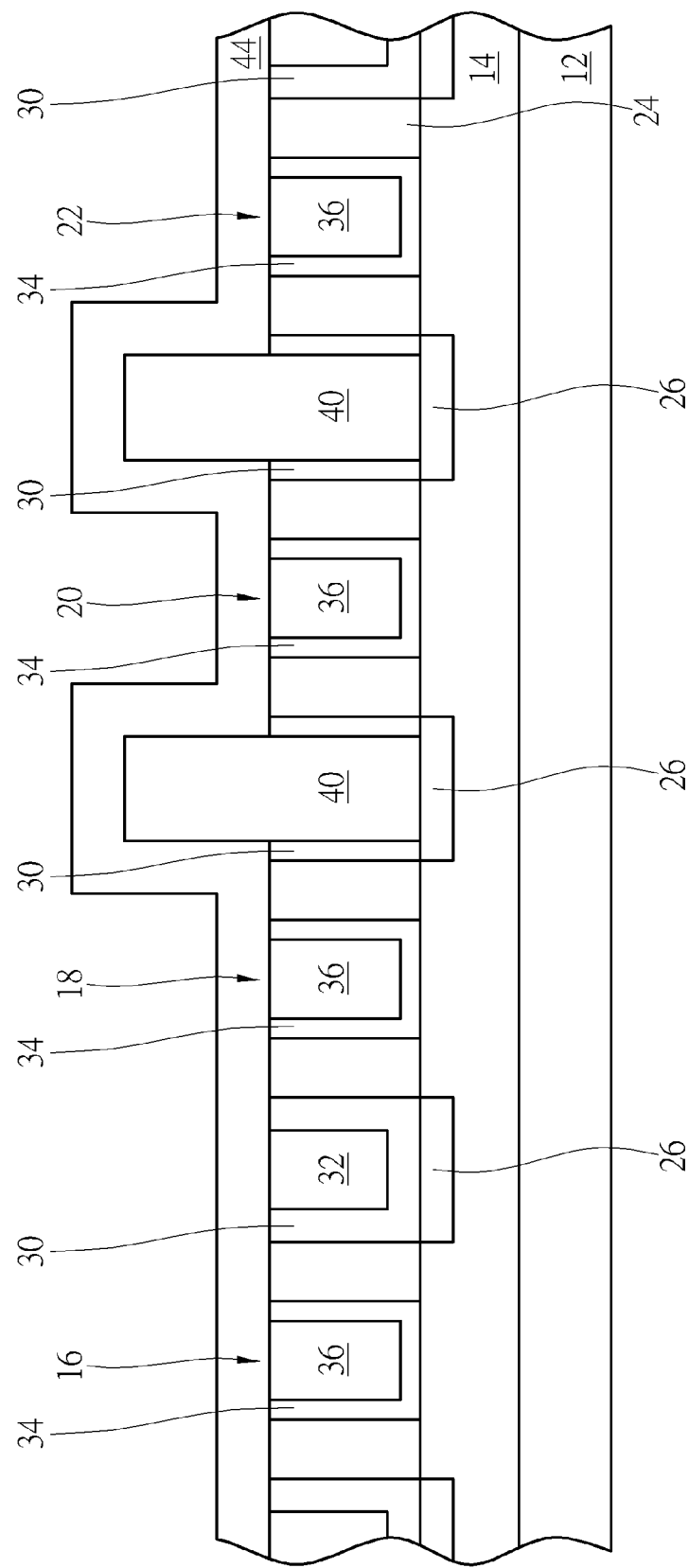

Next, as shown in FIG. 4, a first dielectric layer 44 is formed on the gate structures 16, 18, 20, 22, the ILD layer 32, and first contact plugs 40. In this embodiment, the first dielectric layer 44 is conformally disposed on the ILD layer 32 and gate structures 16, 18, 20, 22 while surrounding the contact plugs 40, in which the first dielectric layer 44 also contacts the work function layer 34 and low resistance metal layer 36 of the metal gates as well as the sidewalls and top surface of the first contact plugs 40 at the same time. In other words, the first dielectric layer 44 is preferably formed along the sidewalls and top surfaces of the ILD layer 32, gate structures 16, 18, 20, 22, and first contact plugs 40 while revealing the surface profiles of these elements.

Figure 5:
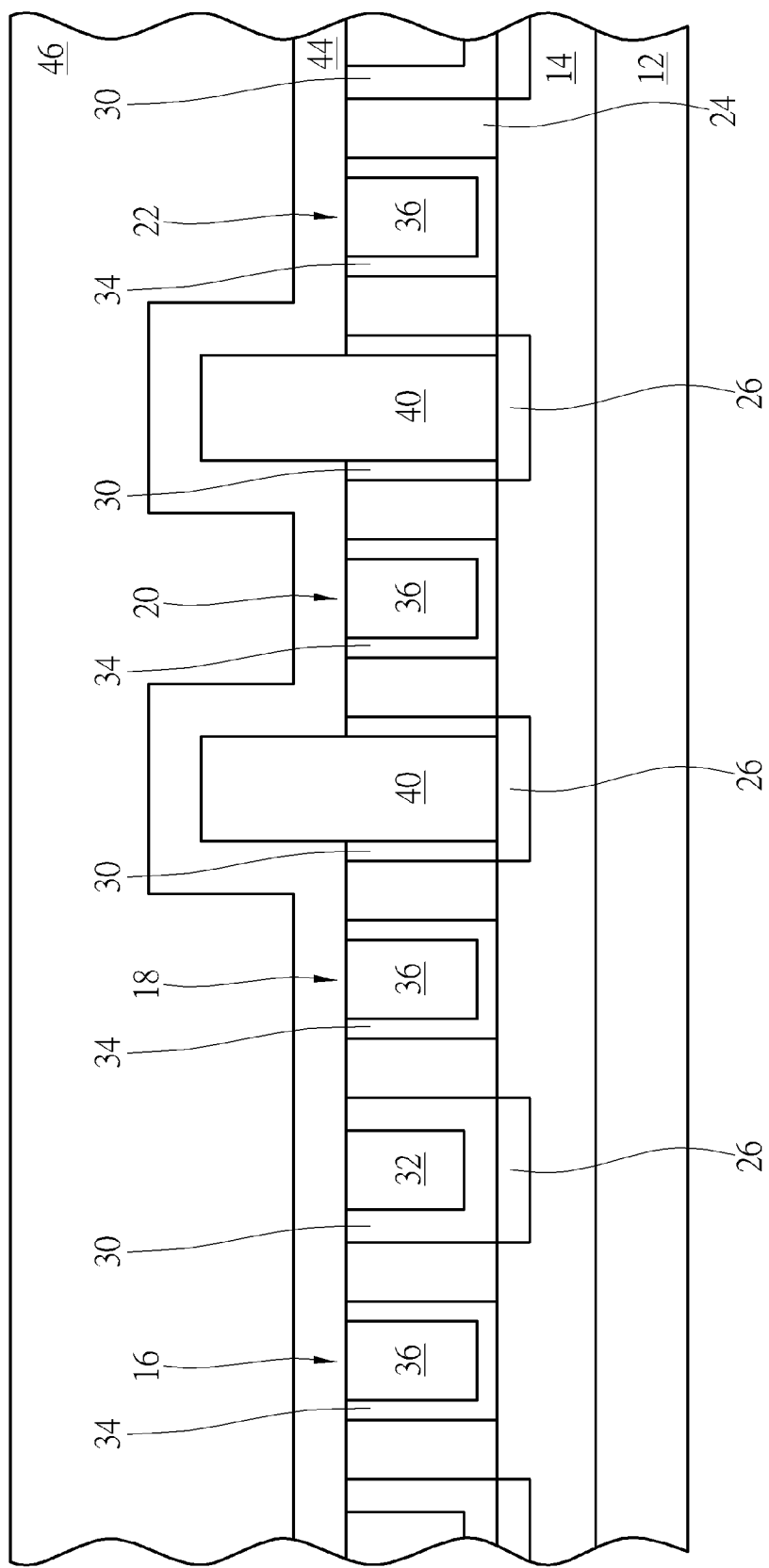

Next, as shown in FIG. 5, a second dielectric layer 46 is formed on the first dielectric layer 44 and deposited between the first contact plugs 40, and a planarizing process, such as CMP process is conducted to remove part of the second dielectric layer 46 so that the remaining second dielectric layer 46 would have a flat and even surface while covering the first dielectric layer 44 completely. In this embodiment, the first dielectric layer 44 and second dielectric layer 46 are preferably composed of different material, such as the first dielectric layer 44 could be composed of silicon nitride while the second dielectric layer 46 could be composed of silicon oxide, but not limited thereto.

Figure 6:
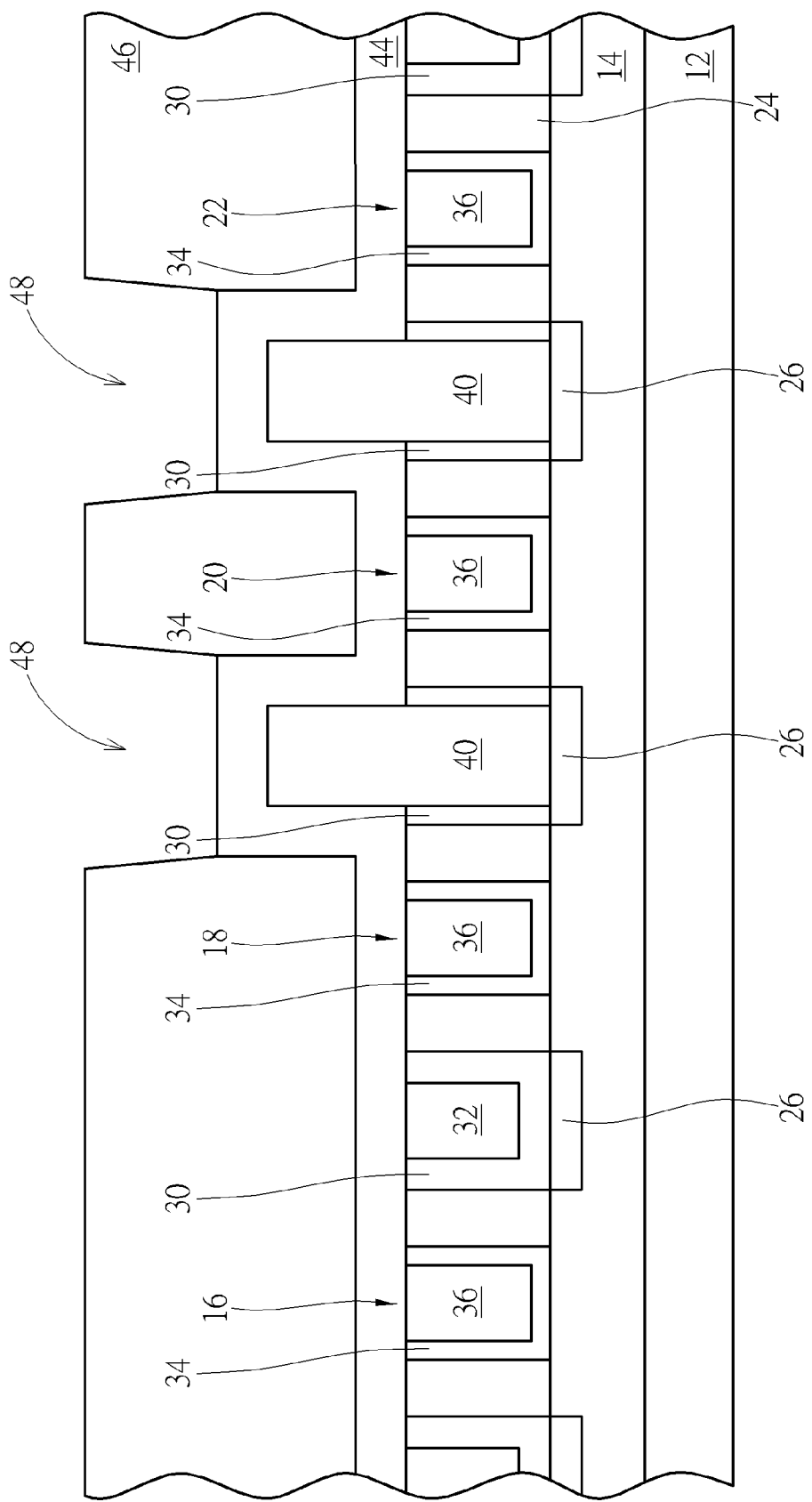

Next, as shown in FIG. 6, a photo-etching process is conducted to remove part of the second dielectric layer 46 above the first contact plugs 40 for forming a plurality of contact holes 48 in the second dielectric layer 46 and also exposing part of the first dielectric layer 44 surface above the first contact plugs 40.

Figure 7:
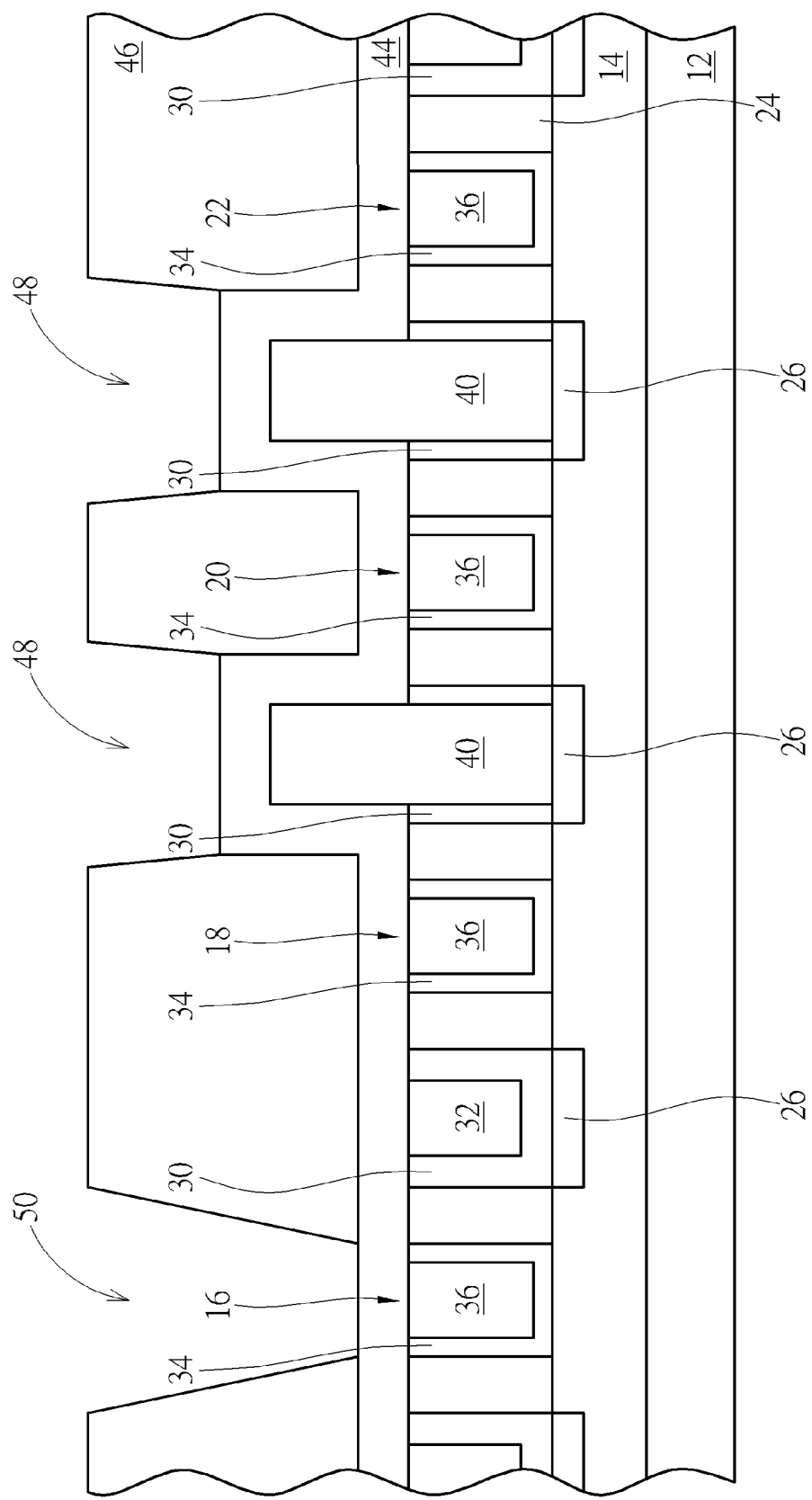

Next, as shown in FIG. 7, another photo-etching process is conducted to remove part of the second dielectric layer 46 above the gate structure 16 for forming a contact hole 50 and exposing part of the first dielectric layer 44 surface above the gate structure 16. It should be noted that despite a two-step photo-etching approach is carried out from FIGS. 6-7 to form contact holes 48 and 50 one after another, it would also be desirable to use a single step photo-etching process to form contact holes 48 and 50 simultaneously depending on the demand of the process, and when such approach is utilized, it would be desirable to stop the etching process either on the surface of the first dielectric layer 44 or etching part of the first dielectric layer 44 but without etching through the entire layer 44, which are all within the scope of the present invention.

Figure 8:
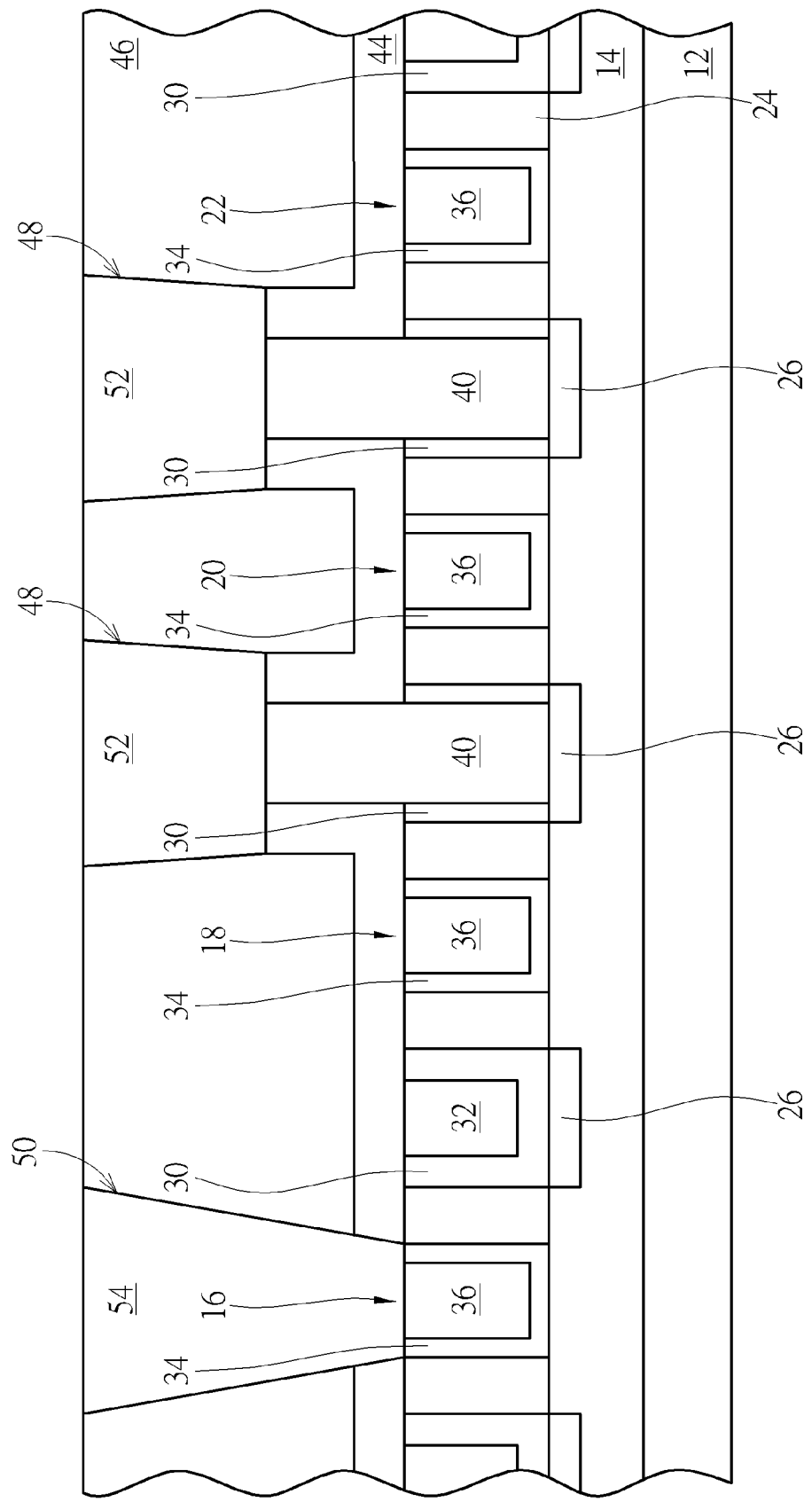

Next, as shown in FIG. 8, another etching or cleaning process is conducted to remove part of the first dielectric layer 44 above the first contact plugs 40 and part of the first dielectric layer 44 above the gate structure 16 for exposing the first contact plugs 40 and gate structure 16 simultaneously. A plurality of second contact plugs 52 and a third contact plug 54 are then formed at the same time, in which the second contact plugs 52 are formed in the second dielectric layer 46 to electrically connect to the first contact plugs 40 while the third contact plug 54 is formed in the second dielectric layer 46 and first dielectric layer 44 to electrically connect the gate structure 16. The formation of the second contact plugs 52 and third contact plug 54 could be accomplished by following the steps for forming aforementioned contact plugs 40 in FIG. 2, and the details of which are not explained herein for the sake of brevity. This completes the fabrication of a semiconductor device according to a preferred embodiment of the present invention.

Referring to FIG. 8, FIG. 8 illustrates a semiconductor device structure according to an embodiment of the present invention. As shown in FIG. 8, the semiconductor device includes a plurality of gate structures 16, 18, 20, 22 on the substrate 12, an ILD layer 32 surrounding the gate structures 16, 18, 20, 22, first contact plugs 40 disposed in the ILD layer 32, a first dielectric layer 44 conformally disposed on the ILD layer 32 and gate structures 16, 18, 20, 22 while surrounding the first contact plugs 40, a second dielectric layer 46 disposed on the first dielectric layer 44, a second contact plug 52 disposed in the second dielectric layer 46 and electrically connected to the first contact plugs 40, and a third contact plugs 54 disposed in the second dielectric layer 46 and first dielectric layer 44 and electrically connected to the gate structure 16.

In this embodiment, the second contact plugs 52 are disposed to directly contact the first dielectric layer 44 and first contact plugs 40 while the top surfaces of the first dielectric layer 44 and first contact plugs 40 are coplanar, the third contact plug 54 is disposed to directly contact the gate structure 16 while the sidewalls of the third contact plug 54 are directly contacting the second dielectric layer 46 and first dielectric layer 44, and the first dielectric layer 44 is disposed to directly contact the top surfaces of the gate structures 16, 18, 20, 22, the top surface of the ILD layer 32, part of the sidewall of the first contact plugs 40, the bottom surface of the second contact plugs 52, and part of the sidewall of the third contact plug 54. The first dielectric layer 44 and second dielectric layer 46 are preferably composed of different material, such as the first dielectric layer 44 could be composed of silicon nitride while the second dielectric layer 46 could be composed of silicon oxide, but not limited thereto.

Figure 9:
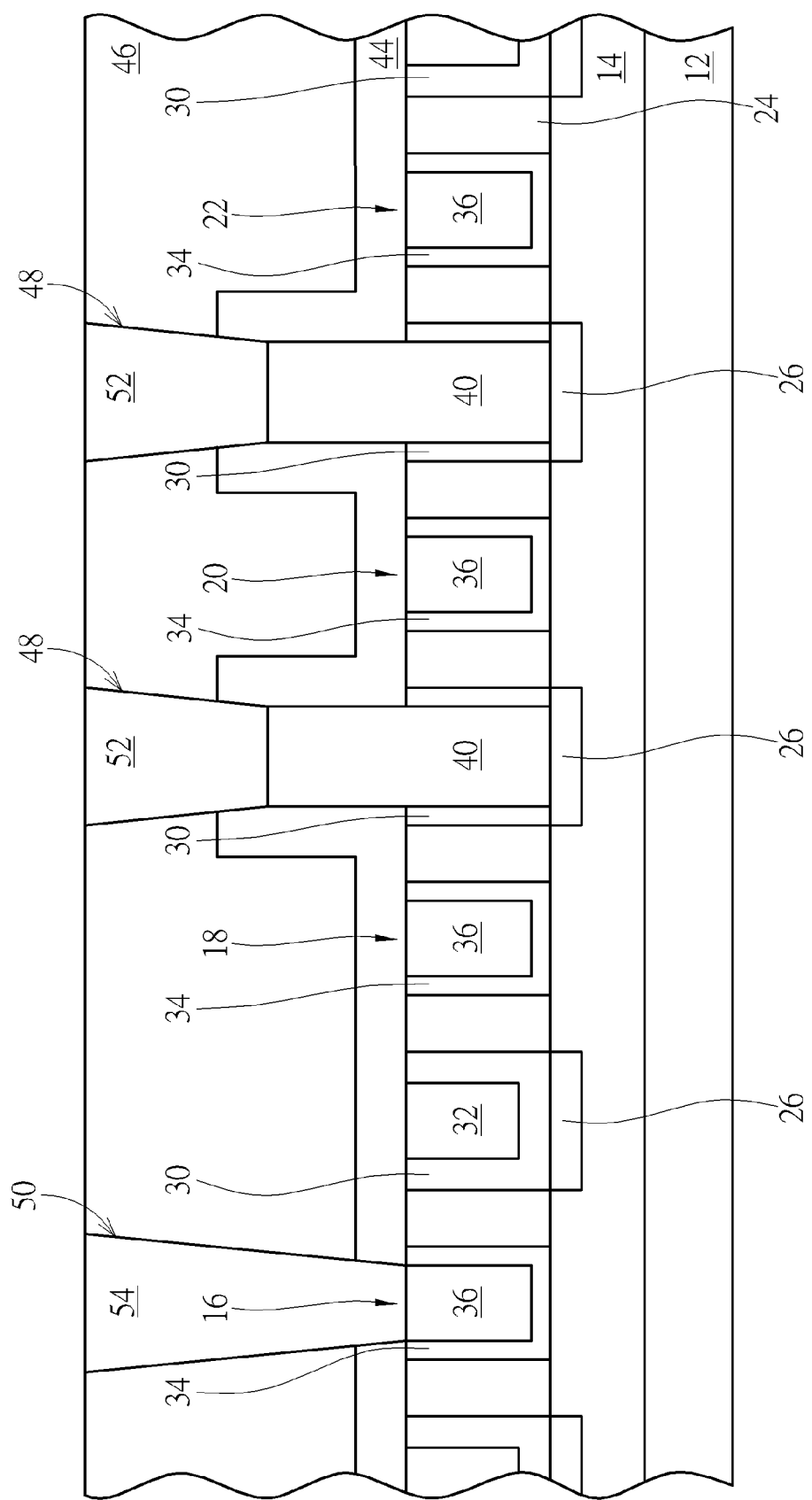
FIG. 9 illustrates a structural view of a semiconductor device according to an embodiment of the present invention.

Referring to FIG. 9, FIG. 9 illustrates a structural view of a semiconductor device according to an embodiment of the present invention. As shown in FIG. 9, it would be desirable to adjust the position and size of the mask utilized for forming the contact holes in FIGS. 6-7 so that the contact holes 48 would only expose the first contact plugs 40 and a small part of the first dielectric layer 40. By doing so, sidewalls of the second contact plugs 52 formed thereafter would contact the first dielectric layer 44 and second dielectric layer 46 directly while the bottom of the second contact plugs 52 would be contacting the first contact plugs 40 directly, which is also within the scope of the present invention.

Overall, the present invention first forms a sacrificial layer on gate structures and ILD layer, forms a first contact plug in the sacrificial layer and ILD layer, completely removes the sacrificial layer and covers a first dielectric layer on the gate structures and first contact plug, forms a second dielectric layer on the first dielectric layer, and forms a second contact plug in the second dielectric layer so that the second contact plug contacts the first dielectric layer and first contact plug at the same time. By placing a first dielectric layer and landing the second contact plug on the first dielectric layer and first contact plug at the same time, it would be desirable to resolve the tiger tooth issue arise due to poor precision of the contact hole openings during fabrication of contact plugs in conventional art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a gate structure thereon and an interlayer dielectric (ILD) layer surrounding the gate structure;
    forming a sacrificial layer on the gate structure;
    forming a first contact plug in the sacrificial layer and the ILD layer;
    removing the sacrificial layer completely; and
    forming a first dielectric layer on and contacting the gate structure and the first contact plug directly.

2. The method of claim 1, further comprising:
    forming a second dielectric layer on the first dielectric layer;
    forming a plurality of contact holes in the second dielectric layer;
    removing part of the first dielectric layer on the first contact plug and part of the first dielectric layer on the gate structure; and
    forming a second contact plug in the second dielectric layer and a third contact plug in the second dielectric layer and the first dielectric layer.

3. The method of claim 2, wherein the second contact plug contacts the first dielectric layer and the first contact plug directly.

4. The method of claim 1, further comprising completely removing the sacrificial layer to expose the gate structure and the first contact plug before forming the first dielectric layer.

5. The method of claim 1, wherein the sacrificial layer comprises silicon oxide, tetraethyl orthosilicate (TEOS), or bottom anti-reflective layer (BARC).

6. The method of claim 2, wherein the first dielectric layer and the second dielectric layer comprise different material.

7. The method of claim 2, wherein the first dielectric layer comprises silicon nitride and the second dielectric layer comprises silicon oxide.

8. The method of claim 1, further comprising completely removing the sacrificial layer to expose the ILD layer, the gate structure, and the first contact plug before forming the first dielectric layer.

* * * * *